United States Patent
Luo et al.

(10) Patent No.: US 12,162,244 B2
(45) Date of Patent: Dec. 10, 2024

(54) DISPLAY DEVICE AND MANUFACTURING METHOD THEREOF

(71) Applicants: Chengdu BOE Optoelectronics Technology Co., Ltd., Sichuan (CN); BOE Technology Group Co., Ltd., Beijing (CN)

(72) Inventors: Xiaofeng Luo, Beijing (CN); Hongqiang Luo, Beijing (CN); Yang Yang, Beijing (CN); Qian Chen, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days.

(21) Appl. No.: 17/561,105

(22) Filed: Dec. 23, 2021

(65) Prior Publication Data

US 2022/0234332 A1  Jul. 28, 2022

(30) Foreign Application Priority Data

Jan. 26, 2021  (CN) .......................... 202110104313.1

(51) Int. Cl.
*B32B 15/08* (2006.01)
*B32B 3/30* (2006.01)
(Continued)

(52) U.S. Cl.
CPC ............... *B32B 15/08* (2013.01); *B32B 3/30* (2013.01); *B32B 7/12* (2013.01); *B32B 15/20* (2013.01);
(Continued)

(58) Field of Classification Search
CPC .. B32B 15/08; B32B 3/30; B32B 7/12; B32B 15/20; B32B 17/10; B32B 27/08; B32B 27/281; B32B 37/16; B32B 2457/206; G06V 40/1306; G06V 40/1318; G06V 40/13; G06V 40/1312; G06V 40/1324; H01L 27/3234; H01L 51/0097; H01L 51/56; H01L 2251/5338
See application file for complete search history.

(56) References Cited

U.S. PATENT DOCUMENTS 6,573,957 B1 * 6/2003 Suzuki ................ G02F 1/13336
349/110
2018/0151641 A1 * 5/2018 Choo .................... G06F 1/1684
(Continued)

FOREIGN PATENT DOCUMENTS

| CN | 110036393 A | 7/2019 | |
| EP | 3457261 A1 | 3/2019 | |
| WO | WO-2020238705 A1 * | 12/2020 | ............. B32B 37/12 |

OTHER PUBLICATIONS

CN202110104313.1 first office action.

*Primary Examiner* — Maria V Ewald
*Assistant Examiner* — Daniel P Dillon
(74) *Attorney, Agent, or Firm* — IPro, PLLC (57) ABSTRACT

A display device and a method of manufacturing the same are provided. The display device includes: a flexible display substrate; a support layer attached to a back side of the flexible display substrate; and a fingerprint module disposed on a side of the support layer away from the flexible display substrate.

13 Claims, 3 Drawing Sheets

(51) Int. Cl.
*B32B 7/12* (2006.01)
*B32B 15/20* (2006.01)
*B32B 17/10* (2006.01)
*B32B 27/08* (2006.01)
*B32B 27/28* (2006.01)
*B32B 37/16* (2006.01)
*G06V 40/13* (2022.01)
*H10K 59/65* (2023.01)
*H10K 71/00* (2023.01)
*H10K 77/10* (2023.01)
*H10K 102/00* (2023.01)

(52) U.S. Cl.
CPC .............. *B32B 17/10* (2013.01); *B32B 27/08* (2013.01); *B32B 27/281* (2013.01); *B32B 37/16* (2013.01); *G06V 40/1306* (2022.01); *G06V 40/1318* (2022.01); *H10K 59/65* (2023.02); *H10K 71/00* (2023.02); *H10K 77/111* (2023.02); *B32B 2457/206* (2013.01); *H10K 2102/311* (2023.02)

(56) References Cited

U.S. PATENT DOCUMENTS

| 2018/0212169 | A1* | 7/2018  | Goto  | H10K 71/00 |
| 2018/0337363 | A1  | 11/2018 | Xu    |            |
| 2019/0073505 | A1* | 3/2019  | Kwon  | H05K 1/028 |
| 2021/0004558 | A1* | 1/2021  | Zeng  | H04M 1/0266 |
| 2021/0224507 | A1* | 7/2021  | Yang  | G06F 1/1637 |

* cited by examiner

DISPLAY DEVICE AND MANUFACTURING METHOD THEREOF

CROSS REFERENCE TO RELATED APPLICATION

This application claims priority to Chinese Patent Application No. 202110104313.1, filed on Jan. 26, 2021 and entitled "DISPLAY DEVICE AND MANUFACTURING METHOD THEREOF", the disclosure of which is incorporated herein by reference in its entirety.

TECHNICAL FIELD

The present disclosure relates to the field of display technologies, and more particularly relates to a display device and a manufacturing method thereof.

BACKGROUND

Fingerprint recognition technology is a common method of identity recognition, and it is also a standard configuration in mobile terminal equipment such as mobile phones. However, with the development of full-screen technology, the fingerprint recognition module of a mobile terminal, such as mobile phone, is gradually moved to the back side of the display screen, to achieve screen fingerprint recognition and full-screen display simultaneously.

Currently, the method of attaching the fingerprint recognition module is: to attach a fingerprint module to the back side of the screen with frame adhesive to determine the location of fingerprint attaching and recognition, and then seal the adhesive at the edge of the contact edge of the fingerprint module and the frame adhesive.

SUMMARY

Embodiments of the present disclosure provide a display device and a manufacturing method thereof.

According to an aspect of the present disclosure, a display device is provided. The display device includes: a flexible display substrate; a support layer, attached to a back side of the flexible display substrate; and a fingerprint module, disposed on a side of the support layer away from the flexible display substrate.

Optionally, the support layer includes one of ultra-thin flexible glass, a polyimide film layer, an aluminum layer, and a plastic layer.

Optionally, the display device further includes: a first adhesive layer, wherein the first adhesive layer is disposed between the support layer and the flexible display substrate, and is attached to both the support layer and the flexible display substrate.

Optionally, the display device further includes: a spacer layer, wherein the spacer layer is disposed between the support layer and the fingerprint module.

Optionally, the display device further includes: a second adhesive layer, wherein the second adhesive layer is disposed between the spacer layer and the support layer, and is attached to both the support layer and the spacer layer.

Optionally, a material of the spacer layer includes plastic.

Optionally, the display device further includes: a stiffener, wherein the stiffener is disposed on a side of the support layer away from the flexible display substrate; and the stiffener is provided with an opening, and the fingerprint module is disposed in the opening.

Optionally, the display device further includes: a third adhesive layer, wherein the third adhesive layer is disposed between the stiffener and the support layer, and is attached to both the support layer and the stiffener.

Optionally, the material of the stiffener includes stainless steel.

Optionally, the display device further includes: a sealant, wherein the sealant is disposed in the opening of the stiffener and is in contact with the fingerprint module and the support layer.

Optionally, the third adhesive layer is a foam adhesive layer.

Optionally, the first adhesive layer is either an optically clear adhesive layer or a pressure-sensitive adhesive layer.

Optionally, the second adhesive layer is either a pressure-sensitive adhesive layer or a water adhesive layer.

Optionally, the fingerprint module includes an optical fingerprint module.

Optionally, the optical fingerprint module is of one of two structures, wherein in one of the two structures, the optical fingerprint module is attached to the support layer, and in the other one of the two structures, the optical fingerprint module is spaced from the support layer.

Optionally, the fingerprint module includes an ultrasonic fingerprint module.

Optionally, the ultrasonic fingerprint module is attached to the support layer.

According to another aspect of the present disclosure, a method of manufacturing a display device is provided. The method includes: attaching a support layer on a back side of a flexible display substrate; and disposing a fingerprint module on a side of the support layer away from the flexible display substrate.

Optionally, the display device further includes a stiffener, and after the support layer is attached to the back side of the flexible display substrate, the method further includes: disposing the stiffener on the side of the support layer away from the flexible display substrate, wherein the stiffener is provided with an opening; and disposing the fingerprint module on the side of the support layer away from the flexible display substrate includes: disposing the fingerprint module on the support layer in the opening.

Optionally, the display device further includes a stiffener, and attaching the support layer on the back side of the flexible display substrate includes: attaching the support layer on a side of the stiffener; and attaching a side of the support layer away from the stiffener to the back side of the flexible display substrate.

BRIEF DESCRIPTION OF THE DRAWINGS

For clearer description of the technical solutions in the embodiments of the present disclosure or in the prior art, the following briefly introduces the accompanying drawings required in the embodiments or the prior art. Apparently, the drawings in the following description merely show some embodiments of the present disclosure and those of ordinary skill in the art may still derive other drawings based on these drawings without creative effort.

DETAILED DESCRIPTION

In order to make the objectives, technical solutions, and advantages of the present disclosure clearer, the present disclosure will be further described in detail below in conjunction with specific embodiments and with reference to the accompanying drawings.

It should be noted that, unless otherwise defined, the technical terms or scientific terms used in the embodiments of the present disclosure shall have the general meanings understood by those of ordinary skills in the field to which this disclosure belongs. The words "first", "second" and similar words used in the embodiments of the present disclosure do not denote any order, quantity, or importance, but are only used to distinguish different components. The words "include" or "comprise" and other similar words mean that the element or item appearing before the word covers the element or item listed after the word and its equivalents, but does not exclude other elements or items. The words "connect to" or "connect with" and similar words are not limited to physical or mechanical connections, but may include electrical connections, whether direct or indirect. The words "up", "down", "left", "right", and the like are only used to indicate the relative position relationship. When the absolute position of the described object changes, the relative position relationship may also change accordingly.

In the related art, the sealant at the contact edge of the fingerprint module and the frame adhesive plays a strengthening and fixing function, and the adhesive is generally thermosetting or ultraviolet (UV) ray curing adhesive. Due to the complex system of adhesive, it is difficult to adjust the expansion and contraction coefficient of the adhesive to be the same as the parameters of the film layers on the back side of the screen. In addition, because the cover and display substrate of the organic light-emitting diode (OLED) display screen are both made of flexible soft materials, they are not strong enough to support the fingerprint recognition module. Therefore, if the fingerprint recognition module is directly attached to the bottom of the OLED display substrate, indentations will occur, resulting in poor appearance.

Figure 1:
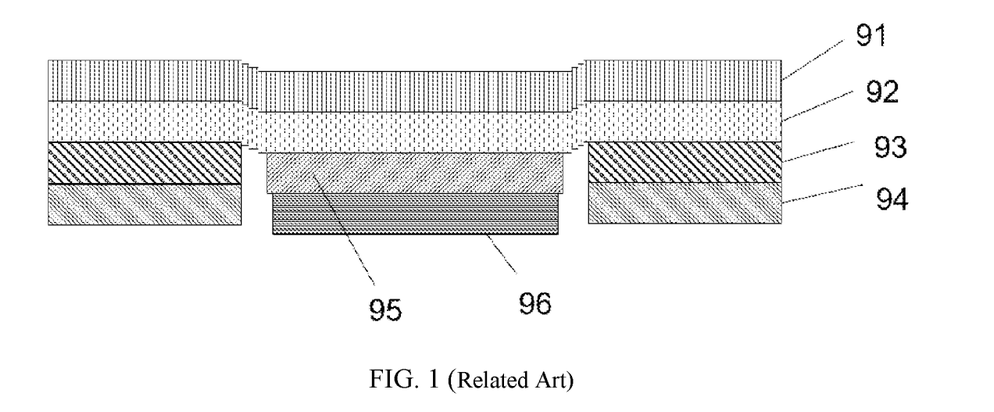
FIG. 1 is a schematic structural diagram of a display device in the related art.

In order to maintain the good folding performance of the OLED screen of the folding product, the cover is generally made of flexible polyimide (PI) and ultra-thin glass (UTG), and the display panel adopts a flexible OLED display substrate with a PI base. As shown in FIG. 1, a stiffener (SUS) 94 is attached to the back side of the flexible display substrate 92 (The flexible display substrate has a front side for displaying images and a back side opposite to the front side) by means of an optically clear adhesive (OCA) 93. The stiffener 94 is provided with an opening, and the fingerprint module 96 is directly attached to the back side of the flexible display substrate 92 at the opening area of the stiffener 94 by means of a pressure-sensitive adhesive (PSA) 95. Since the cover 91 and the flexible display substrate 92 are made of flexible soft materials, they are not strong enough to support the fingerprint module, and are prone to collapse to form indentations. Additionally, due to the complex system of adhesive, it is difficult to adjust the expansion and contraction coefficient of the adhesive to be the same as the parameters of the film layers on the back side of the flexible display substrate. If the fingerprint module is directly attached to the bottom of the flexible display substrate, heat and force may be conducted to the inner film layers of the OLED screen, to cause deformation of the inner film layers, which results in different ambient light reflections and visual differences on the screen, thereby forming indentations. Thus, in terms of quality, the product will be judged to be with poor appearance, which affects the yield of attaching and user experience.

In the process of implementing the present disclosure, the applicant noted that if a structure that can improve the supportiveness of the OLED screen, ensure the flexible and foldable characteristics thereof, and isolate the flexible display substrate from the fingerprint module can be added, some problems in the above-mentioned technology may be solved.

Hereinafter, the technical solutions of the present disclosure are described in conjunction with specific embodiments.

Figure 2:
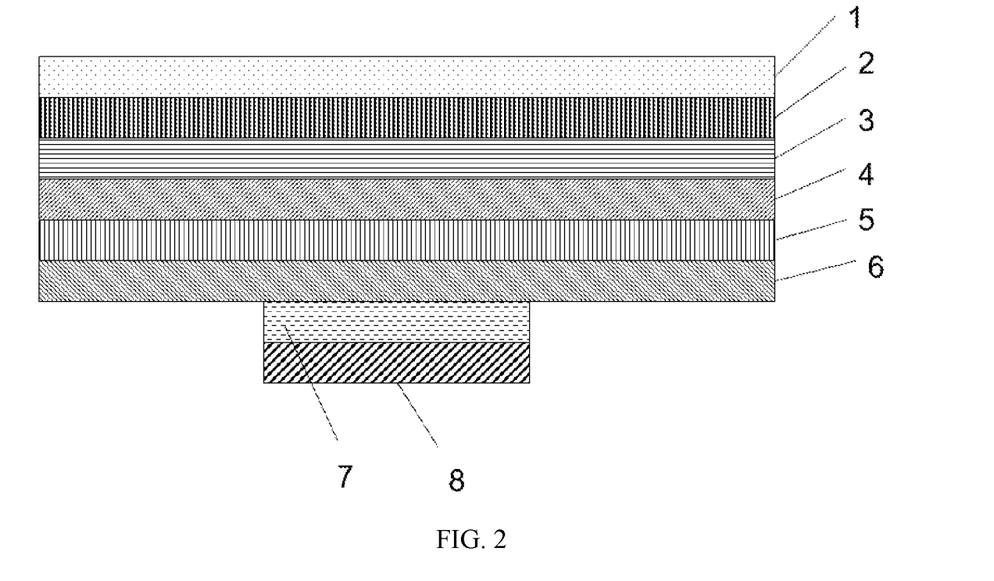
FIG. 2 is a schematic structural diagram of a display device according to an embodiment of the present disclosure.

As shown in FIG. 2, FIG. 2 is a schematic structural diagram of a display device according to an embodiment of the present disclosure. The display device includes a flexible display substrate 4, a support layer 6 and a fingerprint module 8. The flexible display substrate 4 includes a flexible organic electroluminance display (OLED) substrate with a polyimide (PI) base. The support layer 6 is attached to the back side of the flexible display substrate 4, and the support layer 6 is supportive. After support layer 6 is attached to the back side of the flexible display substrate 4, the flexible display substrate 4 is strong enough to support the fingerprint module 8. The fingerprint module 8 is disposed on the side of the support layer 6 away from the flexible display substrate 4, and the fingerprint module 8 is configured to implement the fingerprint recognition function of the flexible display screen.

In summary, in the display device provided in the embodiments of the present disclosure, the support layer is attached to the back side of the flexible display substrate, and then the fingerprint module is disposed on the side of the support layer away from the flexible display substrate. In this way, the tensile force brought by the fingerprint module is balanced by the support of the support layer, thereby reducing the indentations caused by attaching the fingerprint module to the back side of the flexible display substrate.

In addition, the flexible display substrate is separated from the fingerprint module by the support layer, such that the fingerprint module is not directly attached to the back side of the flexible display substrate, to prevent external heat or force from being directly conducted to the sealant of the fingerprint module to cause indentations on the inner film layers of the flexible display substrate at the sealant. Thus, the attachment yield and user experience is improved.

In some optional embodiments, the support layer 6 includes one of ultra-thin flexible glass, a polyimide (PI) film layer, an aluminum layer, and a plastic layer. The ultra-thin flexible glass may be ultra-thin glass (UTG) or other glass materials. UTG not only has good support, but also has good light transmittance (for example, the light transmittance may be greater than or equal to 90%) and low acoustic resistance. The ultra-thin flexible glass almost has no effect on the fingerprint module 8. Therefore, not only the collapse caused by direct attachment between the flexible display substrate 4 and the fingerprint module 8 can be solved, but also the working performance of the fingerprint module 8 is not affected. Thus, the fingerprint module 8 has a good effect of fingerprint signal propagation.

The polyimide film layer also has good transmittance and low acoustic resistance. The aluminum layer and the plastic layer have better supporting performance, which can not only prevent the flexible display substrate 4 from collapsing, but also can reinforce the flexible display substrate 4.

In an optional implementation, the display device further includes a first adhesive layer 5. The first adhesive layer 5 may be an optically clear adhesive (OCA, a special adhesive for gluing transparent optical elements) layer, or a pressure-sensitive adhesive (PSA) layer. The first adhesive layer 5 is disposed between the support layer 6 and the flexible display substrate 4, and is attached to the support layer 6 and the flexible display substrate 4. The first adhesive layer 5 is configured to attach the support layer 6 to the back side of the flexible display substrate 4.

In an optional implementation, the display device further includes a second adhesive layer 7. The second adhesive layer 7 may be PSA layer or a water adhesive layer, and the second adhesive layer 7 is configured to attach the fingerprint module 8 to the side of the support layer 6 away from the flexible display substrate 4. In this way, the fingerprint module 8 is attached and fixed.

Figure 4:
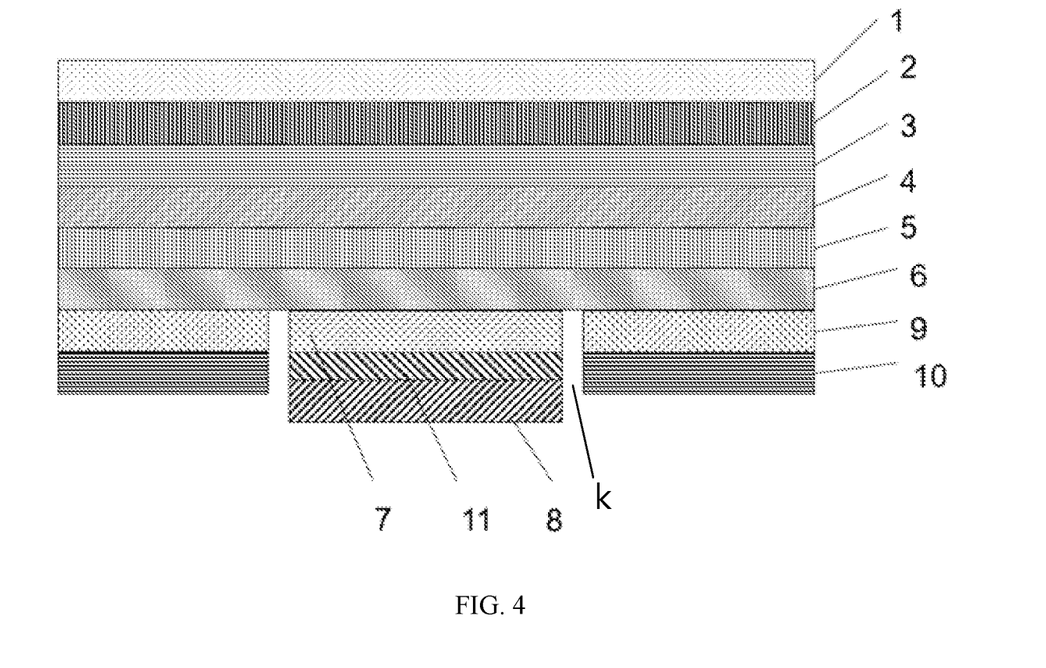
FIG. 4 is a schematic structural diagram of still another display device according to an embodiment of the present disclosure.

Optionally, as shown in FIG. 4, the display device further includes a spacer layer 11. The spacer layer 11 is disposed between the second adhesive layer 7 and the fingerprint module 8, that is, the second adhesive layer 7 is disposed between the spacer layer 11 and the support layer 6, and is attached to the support layer 6 and the spacer layer 11.

The second adhesive layer 7 may be made of plastic or copper. By providing the spacer layer, on the one hand, the supportiveness of the display device can be further improved to further reduce the indentations formed on the flexible display substrate; on the other hand, when the fingerprint module is an ultrasonic fingerprint module, by setting the spacer layer 11 to have a reasonable thickness (such as a thickness determined by testing), the signal volume of the ultrasonic fingerprint module can be increased and the signal noise ratio (SNR) can be increased, thereby improving the fingerprint recognition performance of the fingerprint module.

Figure 3:
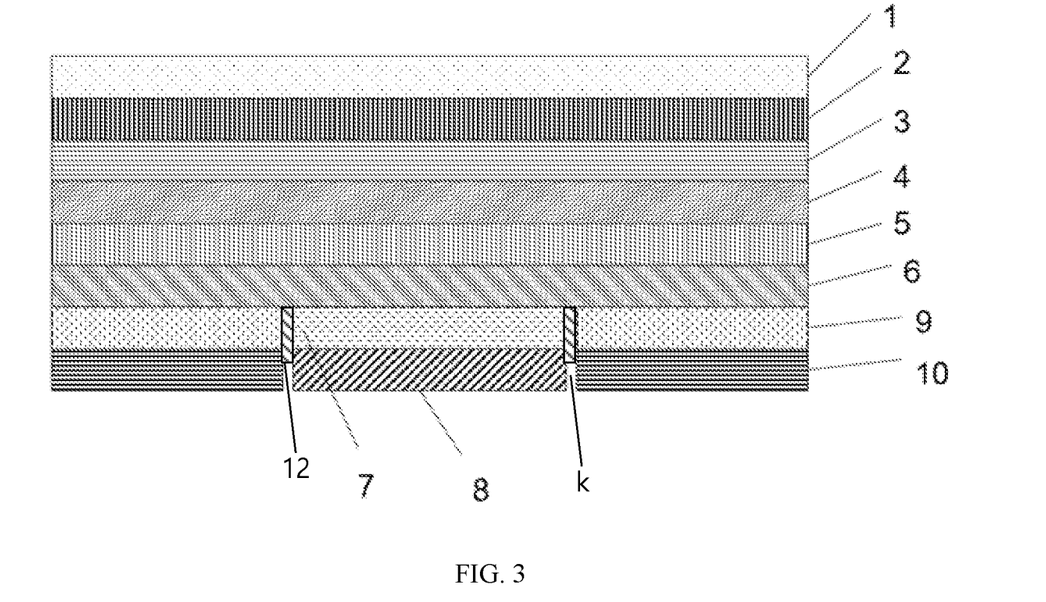
FIG. 3 is a schematic structural diagram of another display device according to an embodiment of the present disclosure.

In an optional implementation, as shown in FIG. 3 and FIG. 4, the display device further includes a stiffener (SUS) 10. The stiffener 10 may be made of stainless steel with a thickness of 0.1 mm. The stiffener 10 is disposed on the side of the support layer 6 away from the flexible display substrate 4. The stiffener 6 is provided with an opening k, and the fingerprint module 8 is disposed in the opening k.

As shown in FIG. 3, in this embodiment, the cover 1 of the display device may be made of flexible PI and UTG, and the flexible display substrate 4 adopts a PI base. The back side of the flexible display substrate 4 adopts 0.1 mm stainless steel as a stiffener 10, to reinforce the overall structure, so that the display device as a whole can have good folding performance.

However, since the stainless steel of the stiffener is almost opaque and the acoustic resistance is also high, an opening may be provided in the fingerprint area of the stiffener 10 when the fingerprint module 8 is attached. However, since no reinforcement process is performed in the opening, and the flexible display substrate 4 and the cover 1 are made of soft materials, collapse may be formed in partial area of the area where the opening is provided, resulting in optical mura and poor appearance, which affects product quality and user experience.

In the embodiments of the present disclosure, the support layer 6 is disposed to improve the supportiveness of the flexible display substrate 4, so that flexible display substrate 4 is strong enough to being attached to the fingerprint module 8, so as to better solve the problem of the opening area collapse and avoid indentations. In addition, since the support layer 6 made of UTG material is provided, the stiffener 10 may be made thinner, so that the thickness of the display device (the display device may be an OLED flexible folding display module) provided in the embodiments of the present disclosure may be further reduced, to further improve the user experience.

Optionally, as shown in FIG. 3, the display device further includes a third adhesive layer 9. The third adhesive layer 9 is disposed between the stiffener 10 and the support layer 6, and is attached to the support layer 6 and the stiffener 10. The third adhesive layer 9 may be a foam adhesive layer, and the foam adhesive layer includes foam and pressure-sensitive adhesive or optically clear adhesive on both sides of the foam. The third adhesive layer 9 is configured to attach the stiffener 10 to the side of the support layer 6 away from the flexible display substrate 4.

Optionally, the display device further includes a sealant 12. The sealant 12 is disposed in the opening k of the stiffener 10, and is in contact with the fingerprint module 8 and the support layer 6. The sealant 12 is provided in the opening to fix and seal the fingerprint module 8, so as to strengthen the stability and tightness of the fingerprint module 8. The sealant 12 may be dripped between the fingerprint module 8 and the wall of the opening k, and sealing is formed after the sealant 12 is cured.

Optionally, the fingerprint module 8 may include an optical fingerprint module or an ultrasonic fingerprint module. An optical fingerprint module or an ultrasonic fingerprint module may be adopted when a transparent support layer 6 such as a support layer made of UTG or PI material is used, or when the stiffener 10 is provided with an opening; and an ultrasonic fingerprint module may be adopted when the support layer is made of opaque materials such as aluminum and plastic, and when the stiffener is not provided with an opening.

In addition, when the fingerprint module 8 is an optical fingerprint module, the optical fingerprint module is of one of two structures. In one of the two structures, the optical fingerprint module is attached to the support layer. In the other one of the two structures, the optical fingerprint component is spaced from the support layer. That is, the optical fingerprint module may be attached to the support layer, or there may be a certain distance between the optical fingerprint module and the support layer.

When the fingerprint module 8 is an ultrasonic fingerprint module, the ultrasonic fingerprint module is attached to the support layer.

In some embodiments of the present disclosure, as shown in FIG. 2, the support layer 6 adopts an aluminum layer or a plastic layer, and the ultrasonic fingerprint module is directly attached to the side of the support layer away from the flexible display substrate.

Optionally, as shown in FIG. 3, in this embodiment, the display device is provided with a stiffener 10, and the stiffener 10 is provided with an opening. The fingerprint module 8 is disposed in the opening and is attached to the side of the support layer away from the flexible display substrate 4 by means of the second adhesive layer 7.

Optionally, in the foregoing embodiments, a polarizer (POL) 3 is further provided between the flexible display substrate 4 and the cover 1, and the cover 1 is attached to the display device by means of a fourth adhesive layer 2 disposed between the cover 1 and the polarizer 3.

In summary, in the display device provided in the embodiments of the present disclosure, the support layer is attached to the back side of the flexible display substrate, and then the fingerprint module is disposed on the side of the support layer away from the flexible display substrate. In this way, the tensile force brought by the fingerprint module is balanced by the support of the support layer, thereby reducing the indentations caused by attaching the fingerprint module to the back side of the flexible display substrate.

In addition, the flexible display substrate is separated from the fingerprint module by the support layer, such that the fingerprint module is not directly attached to the back side of the flexible display substrate, to prevent external heat or force from being directly conducted to the sealant of the fingerprint module to cause indentations on the inner film layers of the flexible display substrate at the sealant. Thus, the attachment yield and user experience is improved.

Figure 5:
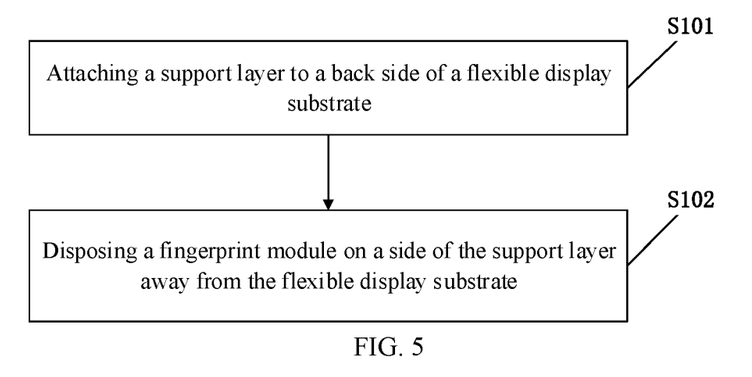
FIG. 5 is a flowchart of a method of manufacturing a display device according to an embodiment of the present disclosure.

An embodiment of the present disclosure further provides a method of manufacturing a display device, which is applicable to manufacture the display device in any one of the above-mentioned embodiments. As shown in FIG. 5, the method includes the following steps.

In step S101, a support layer is attached to a back side of a flexible display substrate.

In step S102, a fingerprint module is disposed on a side of the support layer away from the flexible display substrate.

In summary, according to the method of manufacturing a display device provided by the embodiment of the present disclosure, by adding the procedure of attaching the support layer to the back side of the flexible display substrate, and then disposing the fingerprint module on the side of the support layer away from the flexible display substrate, the tensile force brought by the fingerprint module is balanced by the support of the support layer, thereby reducing the indentations caused by attaching the fingerprint module to the back side of the flexible display substrate.

In addition, the flexible display substrate is separated from the fingerprint module by the support layer, such that the fingerprint module is not directly attached to the back side of the flexible display substrate, to prevent external heat or force from being directly conducted to the sealant of the fingerprint module to cause indentations on the inner film layers of the flexible display substrate at the sealant. Thus, the attachment yield and user experience is improved.

Optionally, the support layer and the upper UTG of the flexible display substrate may be attached in a single process to reduce costs. Alternatively, the support layer provided with the OCA of the first adhesive layer 5 may be directly acquired, to reduce the attachment tolerance.

Optionally, the display device further includes a stiffener, and the method further includes: disposing the stiffener on the side of the support layer away from the flexible display substrate.

In this embodiment, when the display device includes a stiffener, the support layer may be attached after the flexible display substrate is attached; or, the support layer may be attached to the flexible display substrate by means of the first adhesive layer after the support layer and the stiffener are attached by means of the third adhesive layer, so as to reduce the tolerance.

That is, in the embodiment of the present disclosure, the stiffener and the support layer may be attached in two manners.

In the first manner: after step S101, the method further includes: attaching the stiffener to the side of the support layer away from the flexible display substrate. The stiffener is provided with an opening.

Therefore, step S102 may include: disposing the fingerprint module on the support layer in the opening.

In the second manner, step S101 includes: attaching the support layer on a side of the stiffener; and then attaching the side of the support layer away from the stiffener to the back side of the flexible display substrate.

That is, the stiffener and the support layer may be combined first. Then, the structure composed of the stiffener and the support layer may be attached to the back side of the flexible display substrate, which can reduce the tolerance.

An embodiment of the present disclosure further provides a display device. The display device includes: a flexible display substrate; a support layer attached to the back side of the flexible display substrate; and a fingerprint module attached to a side of the support layer away from the flexible display substrate.

Optionally, the support layer includes one of ultra-thin flexible glass, a polyimide film layer, an aluminum layer, and a plastic layer.

Optionally, the display device further includes: a first adhesive layer, configured to attach the support layer to the non-light emitting surface of the flexible display substrate.

Optionally, the display device further includes: a second adhesive layer, configured to attach the fingerprint module to the side of the support layer away from the flexible display substrate.

Optionally, the display device further includes: a spacer layer, disposed between the second adhesive layer and the fingerprint module.

Optionally, the display device further includes: a stiffener attached to the side of the support layer away from the flexible display substrate. The stiffener is provided with an opening, and the fingerprint module is disposed in the opening.

Optionally, the display device further includes:
a third adhesive layer, configured to attach the stiffener to the side of the support layer away from the flexible display substrate.

Optionally, the display device further includes: a sealant, disposed in the opening to fix and seal the fingerprint module.

Optionally, the fingerprint module includes an optical fingerprint module or an ultrasonic fingerprint module.

An embodiment of the present disclosure further provides a method of manufacturing a display device. The method includes: attaching a support layer on a back side of a flexible display substrate; and attaching a fingerprint module to a side of the support layer away from the flexible display substrate.

Optionally, the display device further includes a stiffener, and the method further includes: manufacturing the stiffener on the side of the support layer away from the flexible display substrate.

It can be seen from the above that according to the display device and the manufacturing method thereof provided the embodiments of the present disclosure, the tensile force caused by the fingerprint module is eliminated by support of the support layer, thereby eliminating the indentations caused by attaching the fingerprint module to the back side of the flexible display substrate. In addition, the flexible display substrate is separated from the fingerprint module by the support layer, and the fingerprint module does not need to be directly attached to the back side of the flexible display substrate, to prevent external heat or force from being directly conducted to the sealant of the fingerprint module to cause indentations on the inner film layers of the flexible display substrate at the sealant. Thus, the attachment yield and user experience is improved.

It should be noted that in the drawings, the size of layers and regions may be exaggerated for clarity of illustration. It can be understood that when an element or layer is referred to as being "on" another element or layer, it can be directly on the other element or an intervening layer may be present. In addition, it can be understood that when an element or layer is referred to as being "under" another element or layer, it can be directly under the other element, or there may be more than one intervening layer or element. In addition, it can also be understood that when a layer or element is referred to as being "between" two layers or two elements, it can be the only layer between the two layers or two elements, or more than one intervening layer may also be present. Similar reference numerals indicate similar elements throughout.

Those of ordinary skill in the art should understand that the discussion of any of the above embodiments is merely exemplary, and is not intended to imply that the scope of the present disclosure (including the claims) is limited to these examples. Under the concept of the present disclosure, the above embodiments or technical features in different embodiments may also be combined, the steps can be implemented in any order, and there may be many other variations in different aspects of the embodiments of the present disclosure as described above, which are not provided in details for the sake of brevity.

The embodiments of the present disclosure are intended to cover all such substitutions, modifications, and variations that fall within the broad scope of the appended claims. Therefore, any omissions, modifications, equivalent substitutions, improvements, etc. made within the spirit and principle of the embodiments of the present disclosure should be included in the protection scope of the present disclosure.

What is claimed is:

1. A display device, comprising:
    a flexible display substrate;
    a support layer, attached to a back side of the flexible display substrate, wherein the support layer comprises ultra-thin flexible glass;
    a fingerprint module, disposed on a side of the support layer away from the flexible display substrate;
    a stiffener, wherein the stiffener is disposed on the side of the support layer away from the flexible display substrate, a material of the stiffener comprises stainless steel, and a fingerprint area of the stiffener is provided with an opening penetrating the stiffener, and the fingerprint module is disposed in the opening;
    a spacer layer and a second adhesive layer, wherein the spacer layer is disposed between the second adhesive layer and the fingerprint module, and is attached to both the second adhesive layer and the fingerprint module, and the second adhesive layer is disposed between the spacer layer and the support layer, and is attached to both the support layer and the spacer layer, and the second adhesive layer attaches the fingerprint module to the side of the support layer away from the flexible display substrate via the spacer layer, so that the fingerprint module is disposed in the opening; and
    a sealant, wherein the sealant is disposed in the opening of the stiffener, and is in contact with the fingerprint module and the support layer.

2. The display device of claim 1, further comprising:
    a first adhesive layer, wherein the first adhesive layer is disposed between the support layer and the flexible display substrate, and is attached to both the support layer and the flexible display substrate.

3. The display device of claim 1, wherein a material of the spacer layer comprises plastic.

4. The display device of claim 1, further comprising:
    a third adhesive layer, wherein the third adhesive layer is disposed between the stiffener and the support layer, and is attached to both the support layer and the stiffener.

5. The display device of claim 4, wherein the third adhesive layer is a foam adhesive layer.

6. The display device of claim 2, wherein the first adhesive layer is either an optically clear adhesive layer or a pressure-sensitive adhesive layer.

7. The display device of claim 1, wherein the second adhesive layer is either a pressure-sensitive adhesive layer or a water adhesive layer.

8. The display device of claim 1, wherein the fingerprint module comprises an optical fingerprint module.

9. The display device of claim 8, wherein the optical fingerprint module is of one of two structures, wherein the optical fingerprint module is attached to the support layer in one of the two structures, and the optical fingerprint module is spaced from the support layer in the other one of the two structures.

10. The display device of claim 1, wherein the fingerprint module comprises an ultrasonic fingerprint module.

11. The display device of claim 10, wherein the ultrasonic fingerprint module is attached to the support layer.

12. A method of manufacturing a display device, comprising:
    attaching a support layer on a back side of a flexible display substrate, wherein the support layer comprises ultra-thin flexible glass;
    disposing the stiffener on a side of the support layer away from the flexible display substrate, wherein a material of the stiffener comprises stainless steel, and a fingerprint area of the stiffener is provided with an opening penetrating the stiffener; and
    disposing a fingerprint module on the side of the support layer away from the flexible display substrate; wherein
    disposing the fingerprint module on the side of the support layer away from the flexible display substrate comprises:
        disposing the fingerprint module on the support layer in the opening;
    the method further comprising:
    disposing a second adhesive layer on the side of the support layer away from the flexible display substrate, and disposing a spacer layer between the second adhesive layer and the fingerprint module, wherein the spacer layer is attached to both the second adhesive layer and the fingerprint module, the second adhesive layer is attached to both the support layer and the spacer layer, and the second adhesive layer attaches the fingerprint module to the side of the support layer away from the flexible display substrate via the spacer layer, so that the fingerprint module is disposed in the opening; and
    disposing a sealant in the opening of the stiffener, wherein the sealant is in contact with the fingerprint module and the support layer.

13. The method of claim 12, wherein disposing the support layer on the back side of the flexible display substrate comprises:
    attaching the support layer on a side of the stiffener; and attaching a side of the support layer away from the stiffener to the back side of the flexible display substrate.

\* \* \* \* \*